United States Patent
Hartmann et al.

(10) Patent No.: US 6,515,514 B2
(45) Date of Patent: Feb. 4, 2003

(54) METHOD AND CIRCUIT CONFIGURATION FOR CONTROLLING A DATA DRIVER

(75) Inventors: Henning Hartmann, Oberhaching (DE); Dirk Hottgenroth, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/998,723

(22) Filed: Nov. 30, 2001

(65) Prior Publication Data

US 2002/0079924 A1 Jun. 27, 2002

(30) Foreign Application Priority Data

Nov. 30, 2000 (DE) .......................................... 100 59 513

(51) Int. Cl.[7] .......................................... H03K 19/0185
(52) U.S. Cl. .............................. 326/83; 326/82; 326/93; 326/57
(58) Field of Search .............................. 326/56, 57, 58, 326/68, 81, 82, 83, 93

(56) References Cited

U.S. PATENT DOCUMENTS

| | | |
|---|---|---|
| 5,124,577 A | 6/1992 | Davis et al. |
| 5,617,043 A | 4/1997 | Han et al. |
| 5,654,648 A | 8/1997 | Medhekar et al. |
| 6,008,669 A * | 12/1999 | Gerner ......................... 326/87 |
| 6,310,493 B1 * | 10/2001 | Taniguchi .................... 326/81 |

* cited by examiner

Primary Examiner—Michael Tokar
Assistant Examiner—Anh Q. Tran
(74) Attorney, Agent, or Firm—Laurence A. Greenberg; Werner H. Stemer; Gregory L. Mayback (57) ABSTRACT

A data driver is activated in dependence of a provided bit sequence in order to produce, at the data output of the driver, a data signal which, in the times between periodic reference clock pulse edges, is in each case driven to a high or low validity level in accordance with the binary value of the bits of the provided bit sequence. Directly before selected reference clock pulse edges, a preparation interval of a fixed length is provided, during which the driver is prompted to drive its data output to a medium level between the high validity level and the low validity level. The length of the preparation interval is at least equal to the response time necessary to drive the data output over the level difference between one of the validity levels and the medium level, but is shorter than twice this response time.

12 Claims, 4 Drawing Sheets

METHOD AND CIRCUIT CONFIGURATION FOR CONTROLLING A DATA DRIVER

BACKGROUND OF THE INVENTION

FIELD OF THE INVENTION

The invention relates to a method for controlling a data driver in a manner dependent on a provided bit sequence and to a circuit configuration for carrying out the method. The method and configuration according to the invention is preferably used for transmiting binary-coded information between a memory and an information-processing device.

A main factor limiting the performance of computers at present is the transmission rate of memory information between a memory device and the processor. While processors today achieve clock frequencies, and consequently transmission rates, of 800 MHz, for technical reasons the frequencies for the data exchange between the processor or controller and the memory are several times lower (they are currently around 100 to at most 133 MHz). The data exchange takes place by transmitting binary data signals which, in the times between successive reference clock pulse edges, assume a "high" or a "low" level, depending on the binary value of the bits of a provided bit sequence which represents the information to be exchanged. An upper and a lower threshold value are generally defined for the data signal, the level being regarded as "valid" when the threshold value is reached, and will be referred to here as the high or low "validity level".

Due to the unavoidable response time which a driver sending the data signal requires to complete the full level difference between the high level and the low level, the data signal at the output of the driver only reaches its respective validity level after a certain delay following a change of the input signal, which usually takes place with the reference clock pulse edge. One of the limiting factors for the operating frequency of clocked dynamic memory devices (SDRAMs, Synchronous Dynamic Random Access Memories) is the access time, i.e. the time from the reference clock pulse edge, which enables the data item at the output, until the validity level is reached at the output.

SUMMARY OF THE INVENTION

It is accordingly an object of the invention to provide a method for controlling a data driver and a corresponding configuration which overcome the above-mentioned disadvantages of the heretofore-known methods and configurations of this general type and which shorten the aforementioned access time.

With the foregoing and other objects in view there is provided, in accordance with the invention, a method for controlling a data driver, the method includes the steps of:

activating a data driver in dependence of a provided bit sequence for producing, at a data output of the data driver, a data signal such that the data signal, in time periods between periodic reference clock pulse edges, is in each case driven to one of a high validity level and a low validity level in accordance with a binary value of bits of the provided bit sequence, the high validity level being higher than the low validity level;

providing a preparation interval of a fixed length directly before selected reference clock pulse edges such that, during the preparation interval, the data driver is prompted to drive the data output of the data driver to a medium level provided between the high validity level and the low validity level, the selected reference clock pulse edges including a first reference clock pulse edge and at least all reference clock pulse edges occurring between data items of different binary values; and providing the fixed length of the preparation interval such that the fixed length of the preparation interval is at least equal to a response time required by the data driver to drive the data output of the data driver over a level difference between one of the low and high validity levels and the medium level, and such that the fixed length of the preparation interval is shorter than twice the response time.

In other words, a method for controlling or activating a data driver in a manner dependent on a provided bit sequence, to produce at the data output of the driver a data signal which, in the times between periodic reference clock pulse edges, is in each case driven to a high or low validity level in accordance with the binary value of the bits of the provided bit sequence, is characterized according to the invention by the following features: a predetermined time period after a clock pulse edge, a preparation interval of a fixed length is defined, during which the driver is made to drive its data output to a medium level between the high validity level and the low validity level. The length of the preparation interval is made at least equal to the response time which the driver requires to drive its data output over the level difference between the one or the other validity level and the medium level; however, the preparation interval is made shorter than twice this response time. The selected reference clock pulse edges are at least the first reference clock pulse edge and all those reference clock pulse edges which lie between data items of different binary values.

According to the invention, the activation of the driver is consequently operated with "anticipation", in that, even before the reference clock pulse edges, the output is already driven in each case to a medium level, from which only half the full excursion or level difference remains to be covered. This shortens the time from the reference clock pulse edge to reaching the validity level at the output. This measure is carried out immediately before the first data item and before at least those data items which require level switching. The setting of the preparation interval to at least the response time applicable to half the excursion is intended to ensure with certainty that the output has reached the medium level at the time of the reference clock pulse edge. The restriction of the length of the preparation interval to at most twice this response time is intended to ensure that this interval does not begin before the validity of the current data item is reached. The shorter the preparation interval is within these set limits, the longer the holding time (period of validity) of the data items.

The anticipation or lead according to the invention can be achieved in two different ways. On the one hand, the output can be switched specifically to the medium level during a preparation interval before the delivery of each new data item, for example by switching the amplifier to high output impedance with the output connected via a resistor to a source of the medium level. In many customary bus systems today, terminable drivers which allow switching to high output impedance are used in any case. In this procedure, the access time is improved by the fact that, in the worst case (new data item is inverse to the previous item), only half the output excursion has to be covered, i.e. the access time is shortened by half the rise time of the driver (if this is scaled linearly with the driving input excursion, which does not necessarily have to be the case).

As the second possibility, a genuine "prefetch" can be used, in that it is determined in advance whether and in which direction the output must change in the case of the next data item in order if appropriate to start a correspondingly directed switching operation earlier, i.e. at the beginning of the preparation interval preceding the next data item. Here, too, the medium level is reached at the output at the latest at the next reference clock pulse edge, and consequently the access time for the next data item is shortened. This prefetch of course requires prior knowledge of the binary value of the next data item, that is to say simultaneous (or at least partly contemporaneous) provision of the current bit and the following bit. This can be realized very easily, for example by using a shift register receiving the bit sequence, which in many cases is present anyway. This is because many modules, in particular memory devices, generate a to-be-sent bit sequence extremely quickly or even in parallel and write it to a shift register in parallel for clock-pulse controlled onward transfer.

According to another feature of the invention, a switchable data driver is used as the data driver such that the data driver, in dependence of applied activation signals, is switchable between three switching states, the data output of the data driver being at or above the high validity level when the data driver is in a first one of the three switching states, the data output of the data driver being at or below the low validity level when the data driver is in a second one of the three switching states, and the data output of the data driver being at the medium level when the data driver is in a third one of the three switching states; at the latest from a start of the preparation interval provided before the first reference clock pulse edge and during a duration of each further preparation interval, an activation signal bringing about the third one of the switching states is applied; and with each reference clock signal edge preceding a data item of a first binary value, an activation signal bringing about the first one of the switching states is applied, and, with each reference clock pulse edge preceding a data item of a second binary value, an activation signal bringing about the second one of the switching states is applied.

According to another mode of the invention, the selected reference clock pulse edges further include reference clock pulse edges provided between data items of a same binary value.

According to yet another mode of the invention, the selected reference clock pulse edges only include the first reference clock pulse edge and reference clock pulse edges between data items of different binary values.

A further mode of the method according to the invention includes the step of using a switchable data driver as the data driver such that the data driver, in dependence of applied activation signals, is switchable between three switching states, the data output of the data driver being at or above the high validity level when the data driver is in a first one of the three switching states, the data output of the data driver being at or below the low validity level when the data driver is in a second one of the three switching states, and the data output of the data driver being at the medium level when the data driver is in a third one of the three switching states; applying, at the latest from a start of the preparation interval provided before the first reference clock pulse edge, an activation signal bringing about the third one of the switching states; applying, from a start of preparation intervals provided directly before a respective reference clock pulse edge preceding a data item of a first binary value, an activation signal bringing about the first one of the switching states; and applying, from a start of preparation intervals provided directly before a respective reference clock pulse edge preceding a data item of a second binary value, an activation signal bringing about the second one of the switching states.

Yet a further mode of the method according to the invention includes the step of using a switchable data driver as the data driver such that the data driver, in dependence of applied activation signals, is switchable between two switching states, the data output of the data driver being at or above the high validity level when the data driver is in a first one of the two switching states, the data output of the data driver being at or below the low validity level when the data driver is in a second one of the two switching states; applying, from a start of preparation intervals provided directly before a respective reference clock pulse edge preceding a data item of a first binary value, an activation signal bringing about the first one of the switching states; and applying, from a start of preparation intervals provided directly before a respective reference clock pulse edge preceding a data item of a second binary value, an activation signal bringing about the second one of the switching states.

With the objects of the invention in view there is also provided, a circuit configuration, including:

a data driver including an amplifier with a data input and a tristate output as a data output, the tristate output being switchable into a state of high output impedance by a deactivation signal;

a termination resistor connected to the data output;

a source for providing a medium level lying between a first validity level and a second validity level;

the data output of the data driver being connected, via the termination resistor to the source providing the medium level;

an activation circuit connected to the data input of the amplifier, the activation circuit responding to reference clock pulse edges and to bits of a provided bit sequence, the activation circuit supplying an activation signal to the data input of the amplifier such that, when reference clock pulse edges respectively preceding a data item of a first binary value occur, the activation signal goes to a level driving the data output to the first validity level and, when the reference clock pulse edges respectively preceding a data item of a second binary value occur, the activation signal goes to a level driving the data output to the second validity level; and the activation circuit including a deactivating device applying a deactivation signal to the data driver for a duration of a respective preparation interval provided directly before given ones of the reference clock pulse edges such that, during the preparation interval, the data driver drives the data output to a medium level provided between the first validity level and the second validity level, the given ones of the reference clock pulse edges including a first reference clock pulse edge and at least all reference clock pulse edges between data items of different binary values, and wherein the preparation interval has a fixed length at least equal to a response time required by the data driver to drive the data output over a level difference between one of the first and second validity levels and the medium level, and wherein the fixed length of the preparation interval is shorter than twice the response time.

With the objects of the invention in view there is also provided, a circuit configuration, including:

a data driver including an amplifier with a data input and a tristate output as a data output, the tristate output being switchable into a state of high output impedance by a deactivation signal;

a termination resistor connected to the data output;

a source for providing a medium level lying between a high validity level and a low validity level, the high validity level being higher than the low validity level;

the data output of the driver being connected, via the termination resistor to the source providing the medium level;

a buffer memory for simultaneously providing a current bit of a bit sequence and a directly following bit of the bit sequence;

an activation circuit connected to the data input of the amplifier, the activation circuit responding to reference clock pulse edges and to the current bit and the directly following bit of the bit sequence for supplying an activation signal, the activation circuit supplying the activation signal such that, from a start of a preparation interval preceding a data item of a first binary value to a start of a following preparation interval, the activation signal has a level driving the data output to the high validity level and such that, from a beginning of a preparation interval preceding a data item of a second binary value to a start of a following preparation interval, the activation signal has a level driving the data output to the low validity level; and the activation circuit including a deactivating device for supplying the deactivation signal, the deactivating device supplying the deactivation signal to the data driver from the start of a preparation interval preceding a first one of the reference clock pulse edges until the first one of the reference clock pulse edges appears.

With the objects of the invention in view there is also provided, a circuit configuration, including:

a data driver including an amplifier with a data input and a tristate output as a data output, the tristate output being switchable into a state of high output impedance by a deactivation signal;

a termination resistor connected to the data output;

a source for providing a medium level lying between a high validity level and a low validity level, the high validity level being higher than the low validity level;

the data output of the driver being connected, via the termination resistor to the source providing the medium level;

a buffer memory for simultaneously providing a current bit of a bit sequence and a directly following bit of the bit sequence; and an activation circuit connected to the data input of the amplifier, the activation circuit responding to reference clock pulse edges and to the current bit and the directly following bit of the bit sequence for supplying an activation signal, the activation circuit supplying the activation signal such that, from a start of a preparation interval preceding a data item of a first binary value to a start of a following preparation interval, the activation signal has a level driving the data output to the high validity level and such that, from a start of a preparation interval preceding a data item of a second binary value to a start of a following preparation interval, the activation signal has a level driving the data output to the low validity level.

According to another feature of the invention, a comparison device is operatively connected to the activation circuit for comparing a binary value of a current data item and a binary value of a following data item; and the activation circuit keeps the level of the activation signal constant until, subsequent to the current data item, a preparation interval for the following data item starts and the binary value of the following data item differs from the binary value of the current data item.

Other features which are considered as characteristic for the invention are set forth in the appended claims.

Although the invention is illustrated and described herein as embodied in a method and a circuit configuration for controlling a data driver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The following definition shall apply to the description of the circuit configurations represented. A level referred to as "high" or designated "H" corresponds to the binary or logic value "1" and is positive in comparison with the level referred to as "low" or designated "L", which corresponds to the binary or logic value "0". A small circle symbol at the input or output of a circuit element signifies, as usual, an inversion of the level (from L to H or vice versa). In the signal variations which are shown in the diagrams, the H level is depicted by an upward deflection and the L level by a downward deflection; where a level is undefined, the signal variation is depicted by dashed lines. The transistors represented are preferably field-effect transistors ("FETs") of a MOS type and, depending on the type of conduction of their channel, are referred to as "P-FET" (i.e. with a p-conducting channel) or as "N-FET" (i.e. with an n-conducting channel).

To simplify the description, it shall also be assumed that the high or low validity level in the data signal on the output side is identical to the respective end level H or L.

Figure 1:
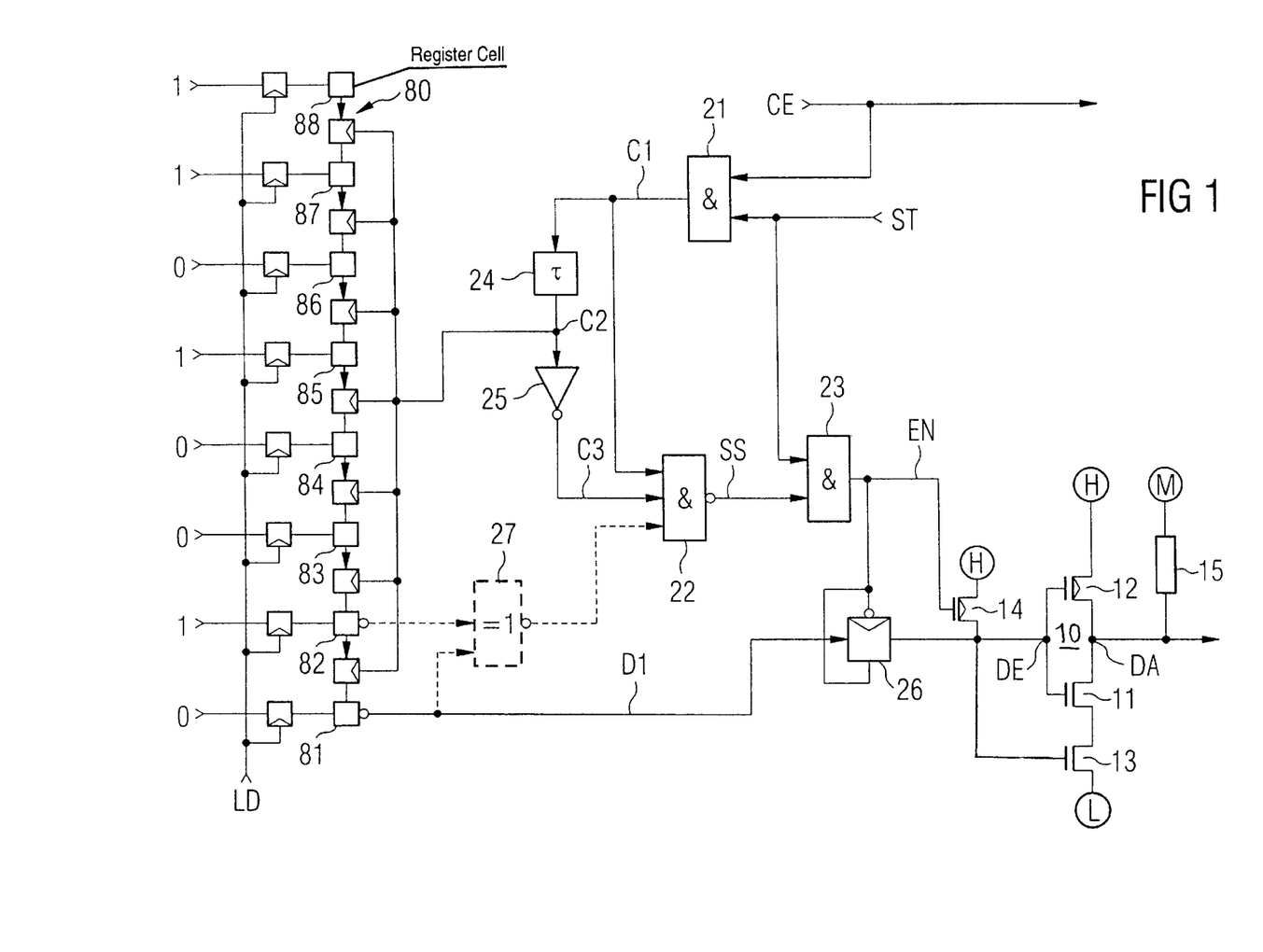
FIG. 1 is a schematic diagram of a first exemplary embodiment of a circuit configuration according to the invention.

Referring now to the figures of the drawings in detail and first, particularly, to FIG. 1 thereof, there is shown a circuit configuration with which a data driver 10, represented on the right in FIG. 1, can be activated in the way according to the invention in order to supply an 8-bit burst with reduced access time at a data output DA. The driver 10 is configured as a CMOS inverter with a tristate output; it contains two N-FETs 11 and 13 and two P-FETs 12 and 14. The gate electrodes of the field-effect transistors 11 and 12 are connected to the data input DE, the channel of the P-FET 12 lies between the data output DA and a source of high potential (H level), and the channels of the N-FETs 11 and 13 lie in series between the data output DA and a source of low potential (L level). The channel of the P-FET 14 lies between the data input DE and the H level. The gate electrodes of the field-effect transistors 13 and 14 are connected for receiving an activation signal EN ("enable" signal).

The data output DA of the driver 10 is connected via an ohmic termination resistor 15, the impedance of which is much higher than the forward impedance of each of the field-effect transistors used, to a source of a medium potential (M level), which preferably lies midway between the L level and the H level. If the activation signal EN is "high", the P-FET 14 is turned off and the N-FET 13 is turned on. In this state, the driver 10 is active: an H level applied to the data input turns off the P-FET 12 and turns on the N-FET 11, so that the data output is brought to L level; an L level applied to the data input turns off the N-FET 11 and turns on the P-FET 12, so that the data output is brought to H level. If EN is "low", the P-FET 14 is kept turned on, so that the data input DE is kept at H level, and consequently the P-FET 12 is kept turned off; furthermore, the N-FET 13 is kept turned off. In this state, the driver 10 is inactive: the connections of the data output DA to the sources of the H and L levels are interrupted, so that the data output DA is kept at the medium M level by the termination resistor.

The data burst which is to be sent from the driver 10 to a target module (not represented), is provided in the cells 81 to 88 of an eight-stage shift register 80, which are filled in parallel via assigned transfer gates by a short loading command LD. To be mentioned as an example is the case in which the data burst includes the bit sequence 0-1-0-0-1-0-1-1.

After the loading operation, the first data item with the value "0" is in the cell 81, the second data item with the value "1" is in the cell 82, and so on to the eighth data item with the value "1", which is in the eighth cell 88. At the output of the cell 81, the data item stored there is available in inverted form as data signal Dl, which can be coupled via a transfer gate 26 to the data input DE of the driver 10.

A first input of a first AND gate 21 receives an external reference clock signal CE, the variation over time of which is represented in the uppermost line of FIG. 1 and includes pulses with a repetition period T and a pulse duty factor of 50%. The falling edges of this clock signal CE form the time base for the clock of the data burst to be supplied at the data output DA of the driver 10. The second input of the AND gate 21 receives a start signal ST, which is switched over from L level to H level as soon as the data items in the register 80 are valid. From this point in time, the external clock signal CE is allowed through to the output of the AND gate 21. The signal Cl appearing there changes with every falling edge of the clock signal CE from H level to L level and reverts again to H level with the respectively following rising edge of the clock signal CE.

The signal Cl is delayed through the use of a delay element 24 with a downstream inverter by a time period T–Tv, Tv being equal to the duration of the preparation interval mentioned above. This interval is intended to be at least equal to the response time Ta which the driver requires to switch over its output from H level or L level to the medium M level, or vice versa, that is to say at least equal to the time which is required for covering half the excursion between H level and L level at the driver output. The signal C2 delayed in such a way is inverted in an inverter 25 and combined as a signal C3 in a NAND gate 22 with the undelayed noninverted signal C1, so that there appears at its output a control signal SS, which goes to H level with each falling edge of the signal C1 and goes to L level with the respectively following rising edge of the signal C3, that is to say after a time T–Tv in each case. The signal SS is combined in an AND gate 23 with the start signal ST, at the output of which the activation signal EN for the driver 10 is generated. The signal is also used for controlling the transfer gate 26.

The signal C2 is also applied to the clock terminals of the shift register 80, in order to shift the data items in the register from cell to cell in the direction of the cell 81 with each falling edge of this signal.

Figure 2:
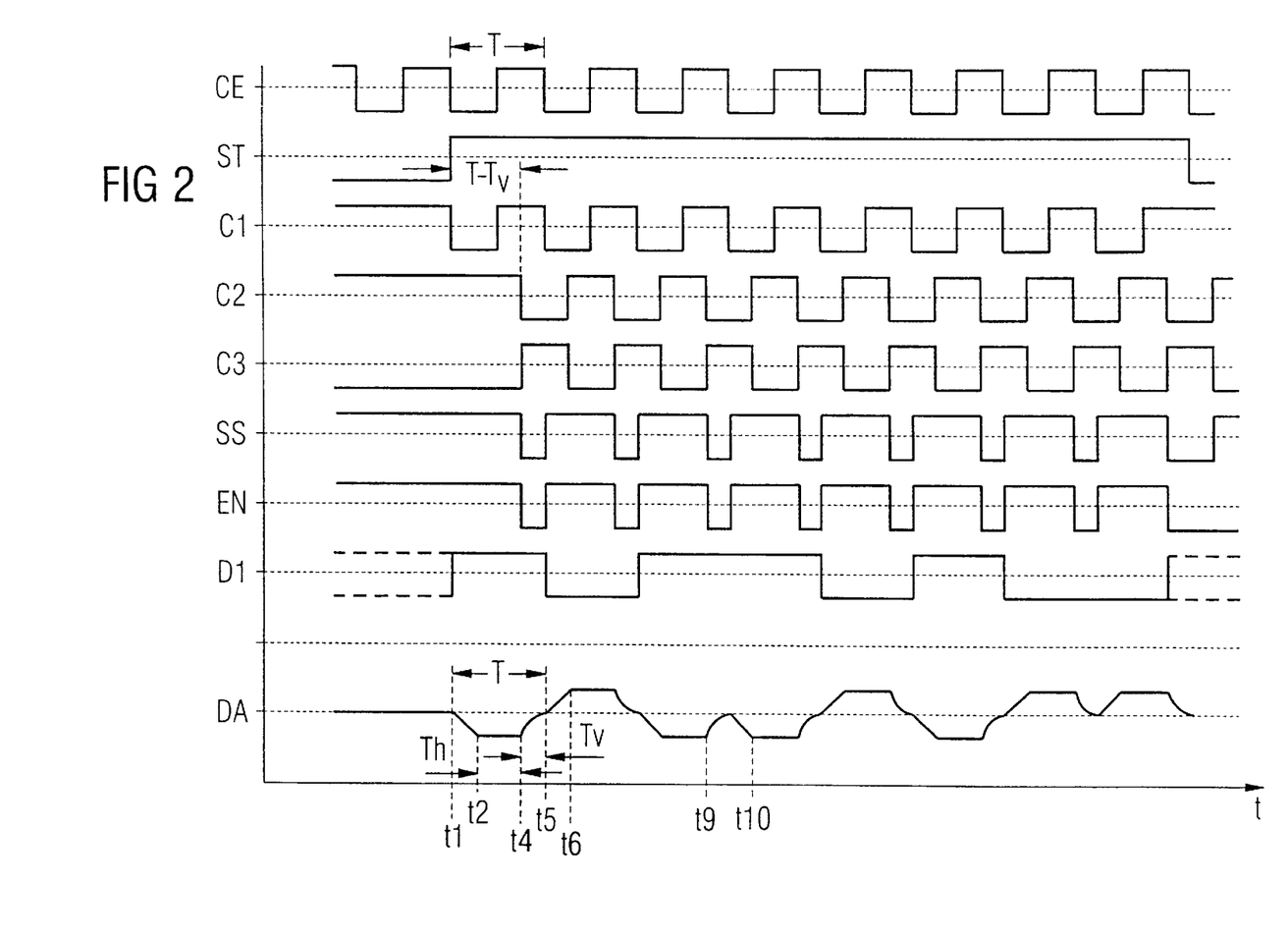
FIG. 2 is a timing diagram illustrating the variation of signals over time that occur at various points of the circuit configuration according to FIG. 1.

Before the start signal ST becomes high, at the point in time t1, the inverted level (H) of the first data item ("0") lies at the input of the transfer gate 26, which however is disabled, since EN is at L level at this time. This state of EN also means that the driver 10 is inactive and its output DA is consequently at M level. At the point in time t1, EN goes to H level, the driver 10 is activated, the transfer gate 26 is enabled, and the driver output DA begins to fall from the M level to the L level, which it has reached after the short response time Ta (half excursion), at the point in time t2. This means that the first data item "0" is available, ready for access, at the output DA, to be precise up until a point in time t4. The interval is known as the holding time Tv of the data item.

At the point in time t4, that is to say a time period T–Tv after t1, the first falling edge of the signal C2 clocks the register 80, so that the second data item ("1") arrives in the cell 81, the inverted level (L) of which then determines the state of the signal D1. At the same time, however, the activation signal EN goes to L level for the duration of the interval Tv. As a result, the transfer gate 26 is disabled and the driver 10 becomes inactive, so that its output DA rises to the M level. The M level is reached after the response time Ta, or at the latest after elapse of the interval Tv, which after all, by definition, is not to be shorter than Ta. At the end of this interval Tv, EN goes back to H level, and the data output begins to rise from the M level to the H level, which it has reached after the short response time Ta (half excursion), at the point in time t6. This means that the second data item "1" is available, ready for access, at the output DA.

The procedure continues in a similar way up to the last (eighth) data item. With each further falling edge of the signal C2, the shift register 80 is clocked once again in order to write the next data item to the cell 81 and deactivate the driver output DA for the duration Tv. At the end of the 8-bit burst, eight clock periods T after t1, the resetting of the start signal ST to L level takes place, whereby the activation signal EN also goes to L level via the AND gate 23 and the driver is definitively deactivated, which brings the output to M level. After this, the next cycle can begin after renewed loading of the shift register 80.

As stated, the time reference for the clock of the data burst sent at the output DA of the driver 10 is formed by the falling edges of the external clock signal CE. With one of these "reference clock pulse edges" at the point in time t1, the switching of the driver 10 begins, as described, from the M level to the level of the first data item, that is to say over a small excursion, which is only half as large as the full excursion between H level and L level. Consequently, the driver output DA already reaches the validity value for the first data item after the short response time Ta, which is approximately half as long as the response time for the full excursion. A time period Tv directly before the next reference clock pulse edge, the driver is deactivated. Since Tv is at least equal to Ta, the driver output DA has reached the M level at the latest at the point in time of this reference edge, so that from there only half the excursion ever has to be covered. Consequently, each data item at the driver output is valid at the latest after the elapse of the short response time Ta as from the assigned reference clock pulse edge. It is consequently possible to access each sent data item at an early time.

In the case of the circuit configuration according to FIG. 1, an interim switch to the M level also takes place whenever two successive data items have the same value. This takes place in the case of the example described at the interval from t9 to t10 between the third and fourth data items (both are "0"). A similar situation occurs between the seventh and eighth data items (both are "1"). These superfluous switching operations can be avoided by providing some kind of combinatorial circuit, which compares each current data item with the next-following data item and, if they are identical, keeps the signal EN at high level. For this purpose, the NAND gate 22 may be provided for example with a third input, which is controlled by the output of an exclusive-NOR gate 27, which compares the data items contained in the cells 81 and 82 of the shift register, as indicated by dashed lines in FIG. 1.

Figure 3:
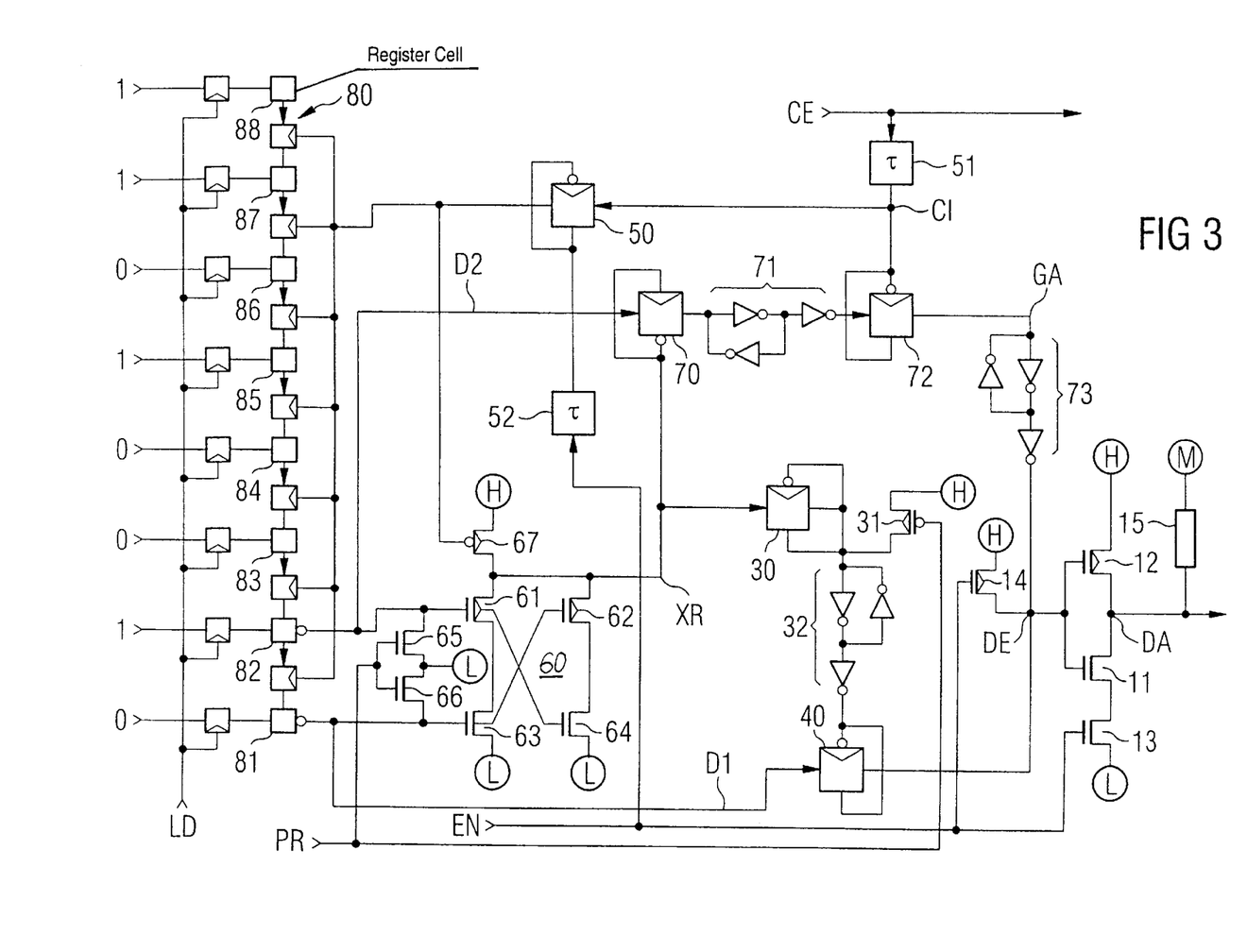
FIG. 3 is a schematic diagram of a second exemplary embodiment of a circuit configuration according to the invention.

Instead of deactivating the driver in preparation before a following data item, the principle according to the invention of anticipatory activation can also be realized by directly prefetching the following data item, in that the driver is already activated from the beginning of the preparation interval with the inverted level of the following data item. FIG. 3 shows an example of a circuit configuration which operates with such a "prefetch", in order to supply an 8-bit burst with reduced access time at the data output of the driver.

The driver 10 shown in FIG. 3, in just the same way as the driver shown in FIG. 1, is constructed as a CMOS inverter with a tristate output and wired with a termination resistor 15. Here, too, the data burst which is to be sent from the driver 10 to a target module (not represented) is provided in the cells 81 to 88 of an eight-stage shift register 80, which are filled in parallel via assigned transfer gates by a short loading command LD. To be mentioned as an example is the case in which the data burst includes the bit sequence 0-1-0-0-1-0-1-1 as in the case described above. After the loading operation, the first data item with the value "0" is in the cell 81, the second data item with the value "1" is in the cell 82, and so on to the eighth data item with the value "1", which is in the eighth cell 88. At the outputs of the cells 81 and 82, the data items stored there are available in inverted form as data signals D1 and D2, respectively.

Before the start of the circuit configuration according to FIG. 3, the activation signal EN is kept low, so that the driver 10 is inactive and supplies the M level at its output DA. Likewise before the start, a one-off short preloading pulse PR with H level is generated, one of the effects of which (in inverted form) is to turn on a P-FET 31 for a short time in order to lock a latch 82 at H level and, as a result, enable a transfer gate 40. This opens the path for the first inverted data item D1 (inverted "0", that is to say a "1") from the cell 81 to the data input DA of the driver 10. However, the driver output DA has not yet been switched over to the assigned H level, because it is inactive due to the low activation signal EN. With the locking of the latch 32 at H level, a further transfer gate 30, which precedes the latch 32 and is of an inverted configuration, is provisionally kept enabled.

Figure 4:
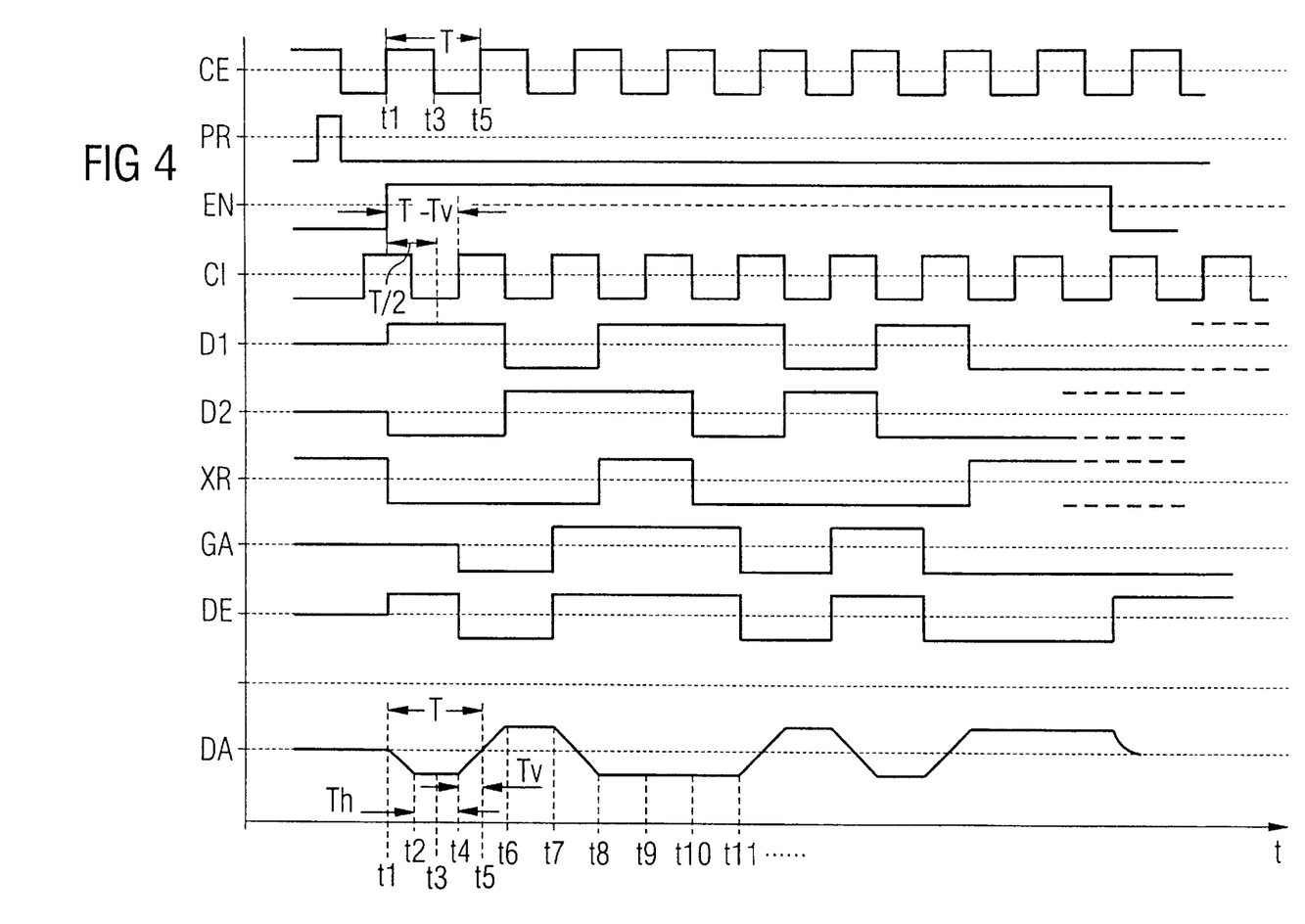
FIG. 4 is a timing diagram illustrating the variation of signals over time that occur at various points of the circuit configuration according to FIG. 3.

As soon as the data items in the cells of the register 80 are valid, the activation signal EN is brought to H level, which takes place at a point in time t1 simultaneously with a rising edge of an external clock signal CE, the variation over time of which is represented in the uppermost line of FIG. 4 and includes pulses with a repetition period T and a pulse duty factor of 50%. The rising edges of this clock signal CE form the time base for the clock of the data burst to be supplied at the data output DA of the driver 10. When the activation signal EN becomes high at the point in time t1, the driver 10 becomes active, so that the inverted level ("high") of the first data item D1, applied to the data input DE from the register cell 81 via the enabled transfer gate 40, has the effect that the data output DA goes from the M level to L level (corresponding to the binary value "0" of the first data item). After a certain unavoidable response time Ta, which is specific to the driver 10, the data output DA has, at a point in time t2, reached the L level, which reproduces the first data item "0".

An internal clock signal CI, which is delayed with respect to the signal CE by an amount T−Tv, is derived from the external clock signal CE through the use of a delay element 51, Tv being the duration of the preparation interval mentioned above. As stated, Tv is chosen such that it is at least equal to the response time Ta which the driver 10 requires to switch over from the M level to H level or L level. Preferably, Tv=Ta, as in the case of the example shown. In the case represented, this value corresponds to a quarter of the period T of the clock signals CE and CI, so that the delay time T−Tv is equal to ¾T.

The falling edges of the internal clock signal CI are used to shift the data items in the shift register 80 in each case in steps in the direction of the cell 81. This clock control is only to begin, however, at a point in time t4 when a time period of T−Tv has elapsed after commenced switching of the driver 10 (point in time t1). Provided for this purpose is a transfer gate 50, which is controlled through the use of a delay element 52 in such a way that it only enables the transfer of the clock signal CI to the clock inputs of the shift register 80 from a point in time t3, when half a clock period (T/2) has elapsed since the activation signal EN has become high.

The inverted output D1 of the register cell 81 is connected to a first input of an exclusive-NOR gate (XNOR gate) 60, which is formed by four field-effect transistors 61–64 and the second input of which is connected to the inverted output D2 of the register cell 82 (signal D2). However, output D1 and output D2 may alternatively also not be inverted. Before the start, both inputs of the XNOR gate 60 have been switched over to L level via two N-FETs 65 and 66 by the preloading pulse PR, so that the output XR of the XNOR gate 60 has been brought to H level by corresponding preloading via the P-FET 67, the forward resistance of which should be greater than that of the gates involved in the XNOR. This disables a transfer gate 70.

From when valid data items are present in the shift register 80, that is to say from when the activation signal EN becomes high at the point in time t1, the XNOR gate 60 compares the binary value of the respectively current data item, which is in the cell 81, with the binary value of the respectively following data item, which is in the cell 82, and supplies low level at its output XR precisely when the two data items have different values (that is always then and only then).

In the case of the example represented, the first two data items are different ("0" and "1"). At the beginning, the data signal D1 is consequently at high level (inverted binary value of the first data item "0"), and the data signal D2 is low (inverted binary value of the second data item "1"). As a consequence, XR goes to L level at the point in time t1, which has two effects: the transfer gate 70 is enabled and then allows the signal D2 through, the level of which is latched (i.e. locked) in a following latch circuit 71. Furthermore, the L level is transferred from the output XR of the XNOR gate also via the still enabled transfer gate 30 to the latch 32 and is latched there, so that the transfer gate 40 and the transfer gate 30 are disabled and also continue to be permanently disabled until renewed preloading takes place through the use of the preloading pulse before the start of a next cycle. Consequently, from now on, the output GA of a transfer gate 72 alone determines the level at the input DE of the driver 10, as described below.

With the following rising edge of the internal clock signal CI from the output of the delay element 51, that is to say with the first rising edge after the activation signal EN becomes high, at the point in time t4=t1+T−Tv, the transfer gate 72 is enabled, so that the level of D2 is taken over from the latch 71 into a further latch 73, following the gate 72. This brings the input DE of the driver 10 to L level at the point in time t4, and its output DA begins to go over from L level to H level. At a point in time t5=t4+Ta=t4+Tv, the medium M level has been reached, and after a further time period, but at the latest at the point in time t6, the H level has been reached, reproducing the second data item "1" in the output signal DA.

With the next falling edge of the internal clock signal CI at the point in time t6, that is to say T−Tv+T/2 after the point in time t1, the shift register 80 is clocked, so that the second data item "1" arrives in the cell 81 and the third data item "0" arrives in the cell 82. The levels of the signals D1 and D2 consequently remain different; the output XR of the XNOR gate 60 goes to L level, and the now H level of the signal D2 (inverted version of the third data item) is applied via the transfer gates 70 and 72 to the driver input DE with the next, that is second, rising edge of the clock signal CI at the point in time t7=t4+T, in order to switch the driver output DA over from the H level to the L level, which reproduces the third data item "0".

With the next falling edge of the internal clock signal CI, at the point in time t8, that is to say 2T−Tv+T/2 after the point in time t1, the shift register 80 is clocked again, so that the third data item "0" arrives in the cell 81 and the fourth data item "0" arrives in the cell 82. The levels of the signals D1 and D2 are now the same; the output XR of the XNOR gate 60 goes to H level, the transfer gate 70 is disabled and the latch circuits 71 and 73, and consequently the driver input DE, also remain at H level when the next, that is third, rising edge of the clock signal CI appears at the point in time t9, so that the driver output remains unchanged at L level, in order to reproduce the fourth data item "0".

With the next falling edge of the internal clock signal CI at the point in time t10, that is to say 3T−Tv+T/2 after the point in time t1, the shift register 80 is once again clocked, so that the fourth data item "0" arrives in the cell 81 and the fifth data item "1" arrives in the cell 82. The levels of the signals D1 and D2 are then different; the output XR of the XNOR gate 60 again goes to L level, and the now L level of the signal D2 (inverted version of the fifth data item) is applied via the transfer gates 70 and 72 to the driver input DE with the next, that is fourth, rising edge of the clock signal CI at the point in time t11=t4+3T, in order to switch the driver output DA over from the H level to the L level, which reproduces the fifth data item "1".

The procedure continues in a similar way up to the last (eighth) data item. With each further falling edge of the internal clock signal C2, the shift register 80 is clocked once again in order to write the "current" data item to the cell 81 and the "following" data item to the cell 82. In the case in which the current data item and the following data item are not the same, the following data item is taken over into the driver 10 with the subsequent rising edge of the clock signal CI; if both data items are the same, no switching takes place at the driver 10, but instead the old value is retained. At the end of the 8-bit burst, the resetting of the activation signal to L level takes place with the eighth rising edge of the internal clock signal CI, whereby the driver is deactivated, which brings the output to M level.

After this, the next cycle can begin after renewed preloading by the pulse PR and renewed filling of the shift register 80.

In the case of FIG. 3, as stated, the time reference for the clock of the data burst sent at the output DA of the driver 10 is formed by the rising edges of the external clock signal CE. With one of these reference clock pulse edges at the point in time t1, that is to say with the first reference clock pulse edge of the cycle, the switching of the driver 10 begins, from the M level to the level of the first data item, that is to say over a small excursion, which is only half as large as the full excursion between H level and L level. Consequently, the driver output DA already reaches the validity value for the first data item after the short response time Ta, which is approximately half as long as the response time for the full excursion. If the next data item of the burst is different, the switching of the driver 10 already begins a time period Tv before the next reference clock pulse edge. Since Tv is at least equal to Ta, the driver output DA has reached the M level at the latest at the point in time of this reference edge (t5=t1+T), so that, from there, only half the excursion has to be covered. Consequently, the second data item at the driver output is valid at the latest after the elapse of the short response time Ta as from the assigned reference clock pulse edge. This also applies to all the following switching operations, so that it is possible to access each sent data item at an early time.

The case Tv=Ta=T/4 described above is only an example. Ta may, of course, also be longer or shorter than T/4, and Tv may also be longer than Ta (but, as stated, not longer than 2Ta). The relationship between T, Ta and Tv determines the holding time Th=T−Tv−Ta (if Ta is the same for falling and rising level transitions).

If it is willingly accepted that the access time for the first data item is not shortened, the variant operating with "prefetch" can be simplified by omitting from it the measures for deactivating the driver 10. In such a case, it may be sufficient to use a driver which can only be switched over between the two validity levels, without separately being able to switch into a high-ohmic (third) output state and without a termination resistor.

The circuit configurations described above with reference to the figures are only examples of logic circuits which combine the data bits provided and the reference clock signal CE as "input variables" with one another in such a way that the switching state of the driver as the "output variable" is a specific, desired logic function of the input variables. This function is the idea of the present invention. Of course, other forms of circuit which perform the same logic function as the configurations shown are also possible or conceivable, and consequently are equally within the scope of the invention.

In particular, the invention can also be applied to systems with a "double data rate", in which a data item is sent both at the rising clock pulse edge and at the falling clock pulse edge of the external reference clock signal CE.

We claim:

1. A method for controlling a data driver, the method which comprises:

activating a data driver in dependence of a provided bit sequence for producing, at a data output of the data driver, a data signal such that the data signal, in time periods between periodic reference clock pulse edges, is in each case driven to one of a high validity level and a low validity level in accordance with a binary value of bits of the provided bit sequence, the high validity level being higher than the low validity level;

providing a preparation interval of a fixed length directly before selected reference clock pulse edges such that, during the preparation interval, the data driver is prompted to drive the data output of the data driver to a medium level provided between the high validity level and the low validity level, the selected reference clock pulse edges including a first reference clock pulse edge and at least all reference clock pulse edges occurring between data items of different binary values; and providing the fixed length of the preparation interval such that the fixed length of the preparation interval is at least equal to a response time required by the data driver to drive the data output of the data driver over a level difference between one of the low and high validity levels and the medium level, and such that the fixed length of the preparation interval is shorter than twice the response time.

2. The method according to claim 1, which comprises:

using a switchable data driver as the data driver such that the data driver, in dependence of applied activation signals, is switchable between three switching states, the data output of the data driver being at or above the high validity level when the data driver is in a first one of the three switching states, the data output of the data driver being at or below the low validity level when the data driver is in a second one of the three switching states, and the data output of the data driver being at the medium level when the data driver is in a third one of the three switching states;

applying, at the latest from a start of the preparation interval provided before the first reference clock pulse edge and during a duration of each further preparation interval, an activation signal bringing about the third one of the switching states; and applying, with each reference clock signal edge preceding a data item of a first binary value, an activation signal bringing about the first one of the switching states, and applying, with each reference clock pulse edge preceding a data item of a second binary value, an activation signal bringing about the second one of the switching states.

3. The method according to claim 2, wherein the selected reference clock pulse edges further include reference clock pulse edges provided between data items of a same binary value.

4. The method according to claim 2, wherein the selected reference clock pulse edges only include the first reference clock pulse edge and reference clock pulse edges between data items of different binary values.

5. The method according to claim 1, which comprises:

using a switchable data driver as the data driver such that the data driver, in dependence of applied activation signals, is switchable between three switching states, the data output of the data driver being at or above the high validity level when the data driver is in a first one of the three switching states, the data output of the data driver being at or below the low validity level when the data driver is in a second one of the three switching states, and the data output of the data driver being at the medium level when the data driver is in a third one of the three switching states;

applying, at the latest from a start of the preparation interval provided before the first reference clock pulse edge, an activation signal bringing about the third one of the switching states;

applying, from a start of preparation intervals provided directly before a respective reference clock pulse edge preceding a data item of a first binary value, an activation signal bringing about the first one of the switching states; and applying, from a start of preparation intervals provided directly before a respective reference clock pulse edge preceding a data item of a second binary value, an activation signal bringing about the second one of the switching states.

6. The method according to claim 1, which comprises:

using a switchable data driver as the data driver such that the data driver, in dependence of applied activation signals, is switchable between two switching states, the data output of the data driver being at or above the high validity level when the data driver is in a first one of the two switching states, the data output of the data driver being at or below the low validity level when the data driver is in a second one of the two switching states;

applying, from a start of preparation intervals provided directly before a respective reference clock pulse edge preceding a data item of a first binary value, an activation signal bringing about the first one of the switching states; and applying, from a start of preparation intervals provided directly before a respective reference clock pulse edge preceding a data item of a second binary value, an activation signal bringing about the second one of the switching states.

7. A circuit configuration, comprising:

a data driver including an amplifier with a data input and a tristate output as a data output, said tristate output being switchable into a state of high output impedance by a deactivation signal;

a termination resistor connected to said data output;

a source for providing a medium level lying between a first validity level and a second validity level;

said data output of said data driver being connected, via said termination resistor to said source providing the medium level;

an activation circuit connected to said data input of said amplifier, said activation circuit responding to reference clock pulse edges and to bits of a provided bit sequence, said activation circuit supplying an activation signal to said data input of said amplifier such that, when reference clock pulse edges respectively preceding a data item of a first binary value occur, the activation signal goes to a level driving the data output to the first validity level and, when the reference clock pulse edges respectively preceding a data item of a second binary value occur, the activation signal goes to a level driving the data output to the second validity level; and said activation circuit including a deactivating device applying a deactivation signal to said data driver for a duration of a respective preparation interval provided directly before given ones of the reference clock pulse edges such that, during the preparation interval, said data driver drives said data output to a medium level provided between the first validity level and the second validity level, the given ones of the reference clock pulse edges including a first reference clock pulse edge and at least all reference clock pulse edges between data items of different binary values, and wherein the preparation interval has a fixed length at least equal to a response time required by said data driver to drive said data output over a level difference between one of the first and second validity levels and the medium level, and wherein the fixed length of the preparation interval is shorter than twice the response time.

8. The circuit configuration according to claim 7, including:

a comparison device operatively connected to said activation circuit for comparing a binary value of a current data item and a binary value of a following data item; and said activation circuit keeping a level of the activation signal constant until, subsequent to the current data item, a preparation interval for the following data item starts and the binary value of the following data item differs from the binary value of the current data item.

9. A circuit configuration, comprising:

a data driver including an amplifier with a data input and a tristate output as a data output, said tristate output being switchable into a state of high output impedance by a deactivation signal;

a termination resistor connected to said data output;

a source for providing a medium level lying between a high validity level and a low validity level, the high validity level being higher than the low validity level;

said data output of said driver being connected, via said termination resistor to said source providing the medium level;

a buffer memory for simultaneously providing a current bit of a bit sequence and a directly following bit of the bit sequence;

an activation circuit connected to said data input of said amplifier, said activation circuit responding to reference clock pulse edges and to the current bit and the directly following bit of the bit sequence for supplying an activation signal, said activation circuit supplying the activation signal such that, from a start of a preparation interval preceding a data item of a first binary value to a start of a following preparation interval, the activation signal has a level driving the data output to the high validity level and such that, from a beginning of a preparation interval preceding a data item of a second binary value to a start of a following preparation interval, the activation signal has a level driving the data output to the low validity level; and said activation circuit including a deactivating device for supplying the deactivation signal, said deactivating device supplying the deactivation signal to said data driver from the start of a preparation interval preceding a first one of the reference clock pulse edges until the first one of the reference clock pulse edges appears.

10. The circuit configuration according to claim 9, including:

a comparison device operatively connected to said activation circuit for comparing a binary value of a current data item and a binary value of a following data item; and said activation circuit keeping the level of the activation signal constant until, subsequent to the current data item, a preparation interval for the following data item starts and the binary value of the following data item differs from the binary value of the current data item.

11. A circuit configuration, comprising:

a data driver including an amplifier with a data input and a tristate output as a data output, said tristate output being switchable into a state of high output impedance by a deactivation signal;

a termination resistor connected to said data output;

a source for providing a medium level lying between a high validity level and a low validity level, the high validity level being higher than the low validity level;

said data output of said driver being connected, via said termination resistor to said source providing the medium level;

a buffer memory for simultaneously providing a current bit of a bit sequence and a directly following bit of the bit sequence; and an activation circuit connected to said data input of said amplifier, said activation circuit responding to reference clock pulse edges and to the current bit and the directly following bit of the bit sequence for supplying an activation signal, said activation circuit supplying the activation signal such that from a start of a preparation interval preceding a data item of a first binary value to a start of a following preparation interval, the activation signal has a level driving the data output to the high validity level and such that, from a start of a preparation interval preceding a data item of a second binary value to a start of a following preparation interval, the activation signal has a level driving the data output to the low validity level.

12. The circuit configuration according to claim 11, including:

a comparison device operatively connected to said activation circuit for comparing a binary value of a current data item and a binary value of a following data item; and said activation circuit keeping the level of the activation signal constant until, subsequent to the current data item, a preparation interval for the following data item starts and the binary value of the following data item differs from the binary value of the current data item.

* * * * *